United States Patent [19]

Hasegawa

[11] Patent Number: 4,743,489
[45] Date of Patent: May 10, 1988

[54] MULTILAYER WIRING SUBSTRATE

[75] Inventor: Shinichi Hasegawa, Tokyo, Japan

[73] Assignee: NEC Corporation, Tokyo, Japan

[21] Appl. No.: 927,175

[22] Filed: Nov. 5, 1986

[30] Foreign Application Priority Data

Nov. 6, 1985 [JP] Japan .................... 60-247150

[51] Int. Cl.$^4$ .................... B32B 3/00; B32B 17/06; B32B 9/00; B32B 15/00
[52] U.S. Cl. .................... 428/210; 428/901; 428/426; 428/431; 428/432; 428/435; 174/68.5
[58] Field of Search .............. 428/210, 901, 435, 426, 428/431, 432; 174/68 R, 68.5

[56] References Cited

U.S. PATENT DOCUMENTS 4,578,304  3/1986  Hamaguchi .................... 428/209

OTHER PUBLICATIONS

"A Comparison of Thin Film, Thick Film, and Co-Fired High Density Ceramic Multilayer with the Combined Technology: T&T HDCM", Dr. M. Terasawa et al., The International Journal for Hybrid Microelectronics, vol. 6, No. 1, Oct. 1983.

*Primary Examiner*—Nancy A. B. Swisher
*Assistant Examiner*—Patrick J. Ryan
*Attorney, Agent, or Firm*—Burns, Doane, Swecker & Mathis

[57] ABSTRACT

A multilayer wiring substrate for mounting a plurality of electronic circuit elements wherein individual wiring layers are separately by insulating layers of an organic material. A plurality of contact pads are formed on the uppermost insulating layer and are connected to wiring members by pressure bonding at least one ceramic buffer member is provided beneath the contact pads to prevent pressure applied during bonding from affecting the wiring layers.

1 Claim, 3 Drawing Sheets

MULTILAYER WIRING SUBSTRATE

BACKGROUND OF THE INVENTION

The present invention relates to a multilayer wiring substrate suitable for mounting a plurality of electronic elements thereon by a thermocompression bonding technique.

A prior-art-multilayer-wiring substrate using an organic material as an insulating material, which is suitable for finer and denser wiring and for decreasing capacitance between signal lines, has been proposed by Dr. M. TERASAWA et al. in a paper entitled "A Comparison of Thin Film, Thick Film, and Co-Fired High Density Ceramic Multilayer with The Combined Technology: T&T HDCM", published in October 1983 in the International Journal for Hybrid Microelectronics, Vol. 6, No. 1, pp. 607 to 615. However, the hardness of such organic materials (about 70–150 vickers) is extremely low as compared with that of inorganic materials such as alumina ($Al_2O_3$) (about 1,500 Vickers). As a result, when wires connected to a large scale integrated circuit (LSI) chip are connected to pads on a substrate by thermocompression bonding under high temperature and pressure, the organic material is caved in or otherwise deformed not only to prevent normal bonding but also to affect the underlying wiring layers to cause poor wirings.

In order to eliminate such disadvantages in the prior art, U.S. Pat. No. 4,578,304 proposes a wiring substrate comprising a special metal layer 3 disposed beneath bonding pads 1. When extremely high pressure is accidentally applied onto the pads 1 at the time of bonding, however, contact between the pads 1 and the metal layer 3 or contact among the pads 1, the metal layer 3 and the uppermost wiring layer 7 may be caused to form unintended wiring routes.

SUMMARY OF THE INVENTION

One object of the invention is, therefore, to provide a multilayer wiring substrate free from the above-mentioned disadvantages of the prior art substrates.

According to an aspect of the invention, there is provided a multilayer wiring substrate for mounting a plurality of electronic circuit elements thereon. The substrate comprises: a plurality of wiring layers having wirings to be connected to the electronic circuit elements; a plurality of insulating layers including an organic material for providing insulation between the wiring layers; a plurality of pads formed on the uppermost one of the insulating layers and connected to wiring members by bonding; and at least one buffer member made of an inorganic insulating material and provided beneath the pads to prevent pressure applied during bonding of the wiring members to the pads from affecting the wiring layers.

BRIEF DESCRIPTION OF THE DRAWINGS

Other features and advantages of the invention will become more apparent from the following detailed description when taken in conjunction with the accompanying drawings in which.

In the drawings, the same reference numerals represent the same structural elements.

DESCRIPTION OF THE PREFERRED EMBODIMENT

Figure 1:
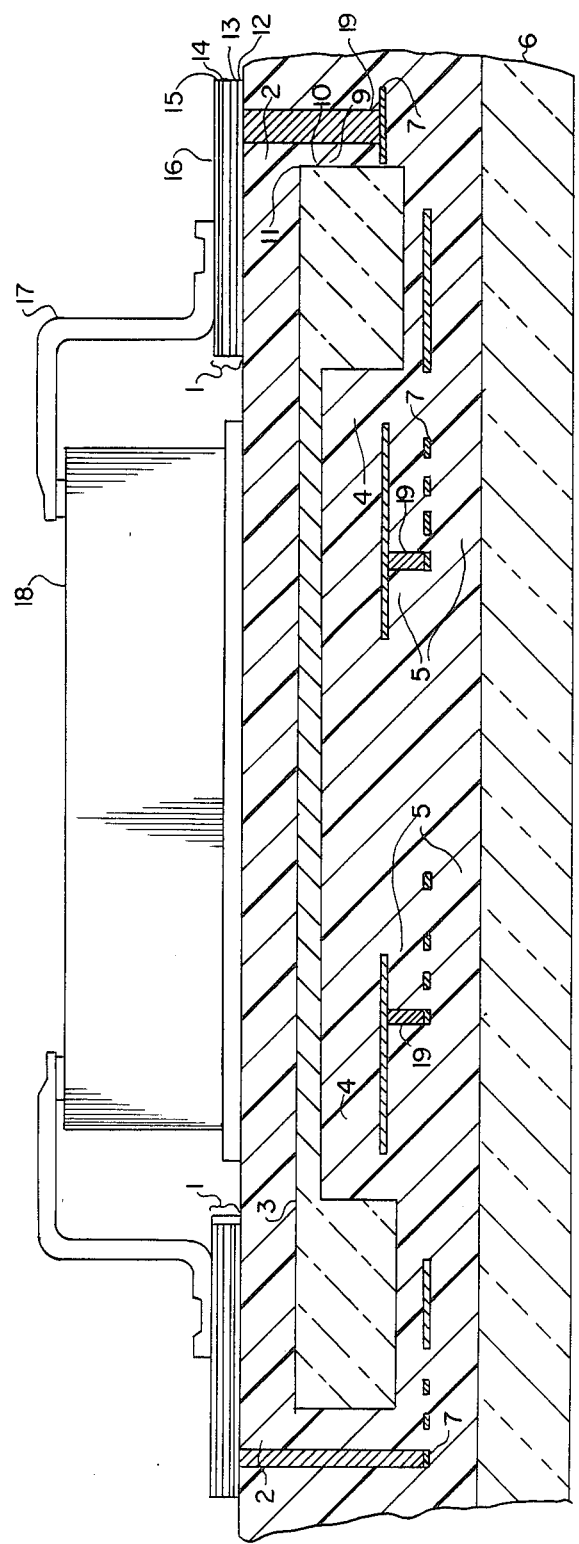
FIG. 1 is a cross-sectional view of an embodiment of the invention.
Figure 2:
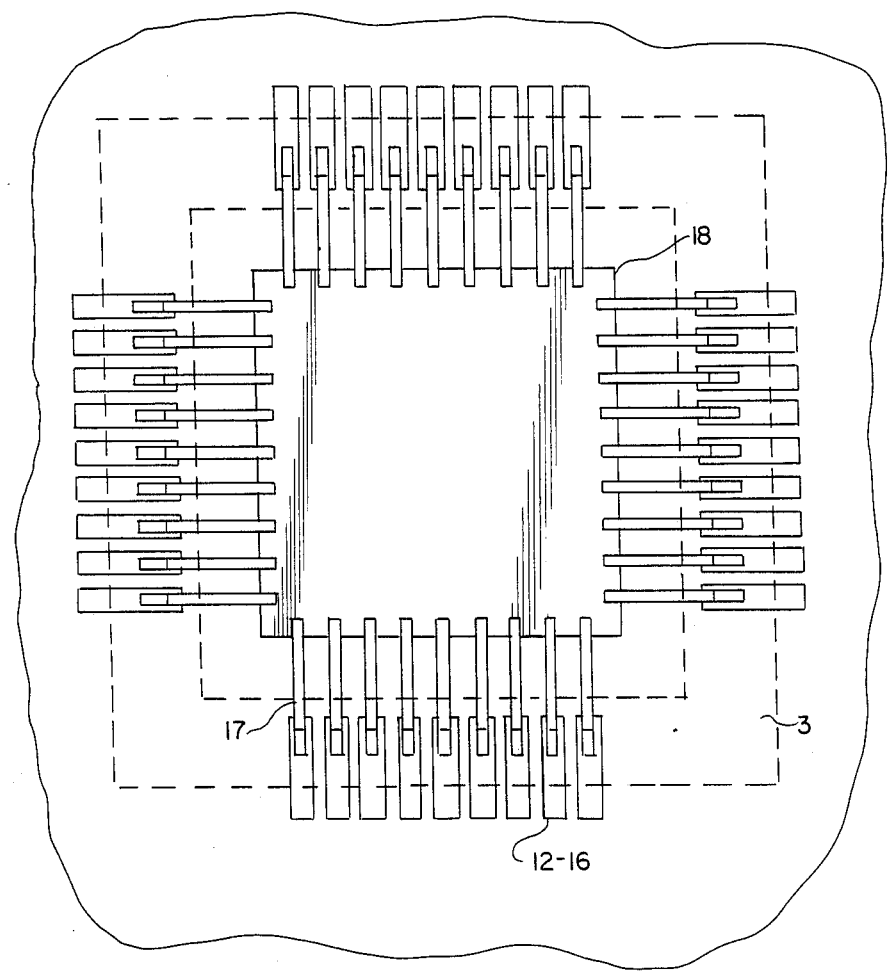
FIG. 2 is a plan view of the embodiment.

Referring to FIGS. 1 and 2, an embodiment of the invention comprises a ceramic layer 6 on which an insulating layer 5 having wiring layers 7 disposed therein is formed, a buffer member 3 of an inorganic material provided on the wiring layers 7 via an insulating layer 4, a plurality of bonding pads 1 formed above the buffer member 3 via an insulating layer 2, a plurality of integrated circuit (IC) chips 18 (whose one is representatively shown in FIGS. 1 and 2) mounted on the insulating layer 2, leads 17 made of gold and electrically connecting the pads 1 to the chip 18, respectively, and via-fills 19 which electrically interconnect the wiring layers 7 as well as connect the wiring layers 7 to the pads 1. Each of the wiring layers 7 performs a signal transmission. The ceramic layer 6 is made of alumina, for example, while the insulating layers 2, 4 and 5 are made of an organic material such as polyimide. The buffer member 3 may be a ceramic material.

Referring to FIGS. 3A through 3E, a method for manufacturing the main section of the embodiment will be described hereinbelow.

Figure 3A:
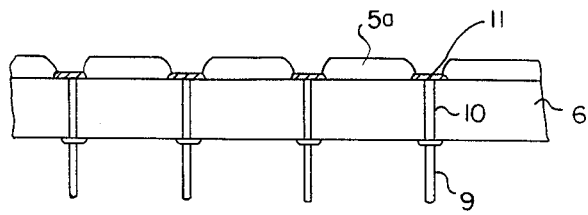
FIGS. 3A through 3E are cross-sectional views for illustrating a manufacturing method of the embodiment.
Figure 3B:
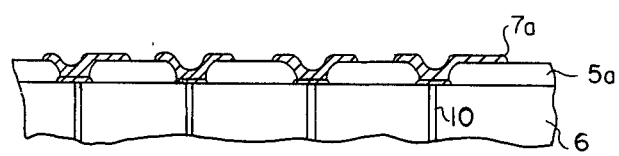
Figure 3C:
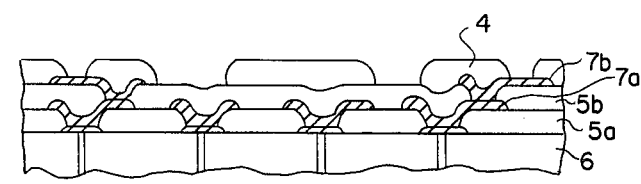
Figure 3D:
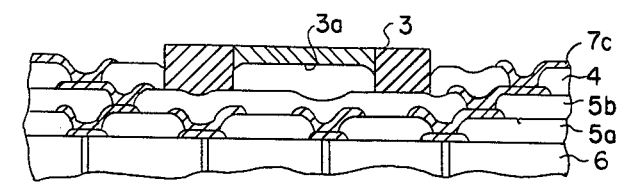
Figure 3E:
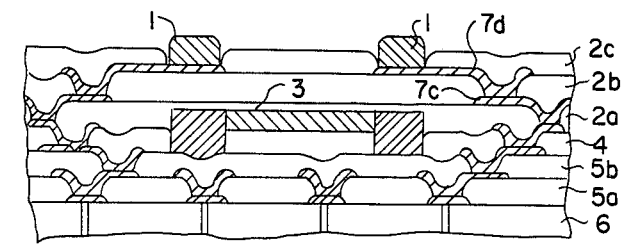

Referring to FIG. 3A, a ceramic substrate 6 composed of alumina, for instance, is first prepared. The substrate 6 is provided with a plurality of terminals 9 on the lower surface thereof to transmit and/or receive signals. A plurality of through-hole wirings 10 penetrate the substrate 6 each having one end thereof connected to the terminals 9 with the other end exposed on the upper surface of the substrate 6. The terminals 9 and the through-hole wirings 10 are omitted from FIG. 1. Electrically conductive pads 11 are formed to cover portions of the substrate 6 where the other ends of the through-holes 10 are exposed. Then, an insulating layer 5a made of polyimide resin is formed so as to expose the pads 11. Referring to FIG. 3B, a wiring layer 7a composed of copper or gold is then formed on the insulating layer 5a in a desired pattern by a thin-film method. As shown in FIG. 3C, an insulating layer 5b, a wiring layer 7b and an insulating layer 4 are then sequentially formed in respective patterns as well. As shown in FIG. 3D, the ceramic member 3 which has been prepared in advance is mounted on the insulating layer 4 at a predetermined position. In the embodiment, the ceramic member 3 has a concavity at the center of the lower surface thereof so as to engage closely with a predetermined portion of the insulating layer 4. This may prevent movement of the member 3. Referring to FIG. 3E, an insulating layer 2a is formed to cover the member 3. A wiring layer 7c, an insulating layer 2b, a wiring layer 7d and an insulating layer 2c are then sequentially formed. Lastly, pads 1 having the structure similar to those disclosed in the above-mentioned U.S. Pat. No. 4,578,304 are formed.

In the embodiment, since the buffer member 3 of an inorganic insulating material having a high hardness is interposed between the bonding pads 1 and the wiring layers 7, any pressure applied during bonding of the leads 17 to the pads 1 never affects the wiring layers 7. Moreover, because the member 3 is an insulator, no unintended wiring route is formed even though two or more of the pads 1 come into contact with the member 3 under excessive pressure accidentally applied thereto during bonding.

While this invention has thus been described in conjunction with the preferred embodiment thereof, it will now readily be possible for those skilled in the art to put this invention into practice in various other manners.

What is claimed is:

1. A multilayer wiring substrate for mounting a plurality of electronic circuit elements comprising:

a plurality of wiring layers having wirings to be connected to said electronic circuit elements;

a plurality of insulating layers including an organic material for providing insulation between said wiring layers;

a plurality of pads formed on the uppermost one of said insulating layers and connected to wiring members by pressure bonding; and at least one buffer member provided beneath said pads and made of a ceramic material to prevent pressure applied during bonding of said wiring members to said pads from affecting said wiring layers.

* * * * *

UNITED STATES PATENT AND TRADEMARK OFFICE
CERTIFICATE OF CORRECTION

PATENT NO. : 4,743,489
DATED : May 10, 1988
INVENTOR(S) : Shinichi Hasegawa

It is certified that error appears in the above-identified patent and that said Letters Patent is hereby corrected as shown below: Title page:

Abstract: Line 3, change "separately" to --separated--.

Line 6, change "bonding at" to --bonding. At--.

Signed and Sealed this

Twentieth Day of December, 1988

*Attest:*

DONALD J. QUIGG

*Attesting Officer*  *Commissioner of Patents and Trademarks*